United States Patent
Takshi et al.

(10) Patent No.: US 9,911,540 B1
(45) Date of Patent: Mar. 6, 2018

(54) PIEZOELECTRIC-BASED SOLAR CELLS

(71) Applicants: Arash Takshi, Tampa, FL (US); Anand Kumar Santhanakrishna, Tampa, FL (US)

(72) Inventors: Arash Takshi, Tampa, FL (US); Anand Kumar Santhanakrishna, Tampa, FL (US)

(73) Assignee: University of South Florida, Tampa, FL (US)

( * ) Notice: Subject to any disclaimer, the term of this patent is extended or adjusted under 35 U.S.C. 154(b) by 2 days.

(21) Appl. No.: 15/238,935

(22) Filed: Aug. 17, 2016

Related U.S. Application Data (60) Provisional application No. 62/206,480, filed on Aug. 18, 2015.

(51) Int. Cl.
| | |
|---|---|
| H01L 31/0256 | (2006.01) |
| H01G 9/20 | (2006.01) |
| H01L 51/44 | (2006.01) |
| H01L 51/42 | (2006.01) |

(52) U.S. Cl.
CPC ......... H01G 9/2018 (2013.01); H01G 9/2059 (2013.01); H01L 51/4273 (2013.01); H01L 51/442 (2013.01)

(58) Field of Classification Search
CPC .. H01G 9/2018; H01G 9/2059; H01G 51/442; H01G 51/4273
USPC ........................................................ 136/256
See application file for complete search history.

(56) References Cited

U.S. PATENT DOCUMENTS

| | | | |
|---|---|---|---|
| 7,705,523 B2 | 4/2010 | Wang et al. | |
| 2010/0258160 A1* | 10/2010 | Wang | H01G 9/2086 136/246 |
| 2011/0041895 A1* | 2/2011 | Carroll | B82Y 10/00 136/250 |
| 2013/0276869 A1 | 10/2013 | No et al. | |

FOREIGN PATENT DOCUMENTS

| | | |
|---|---|---|
| CN | 10317781 A | 6/2013 |
| CN | 103199748 A | 7/2013 |

OTHER PUBLICATIONS

Kumar, et al., "Energy harvesting based on semiconducting piezo-electric ZnO nanostructures", Nano Energy, 2012.
Kumar, et al., "Piezo-phototronics effect on nano/microwire solar cell", Energy and Environmental Science, 2012.
Yang, et al., "Flexible Hybrid energy cell for simultaneously harvesting thermal, mechanical, and solar energies", ACS Nano, vol. 7, No. 1, 2013.
Shoaee, et al., "Acoustic enhancement of polymer/ZnO nanorod photovaltaic device performance", Advanced materials, 26 (2), 2014.

* cited by examiner

*Primary Examiner* — Jayne Mershon
(74) *Attorney, Agent, or Firm* — Thomas | Horstemeyer, LLP (57) ABSTRACT

In one embodiment, a solar cell includes a transparent electrode, a photoactive layer, and an electron transport layer positioned between the transparent electrode and the photoactive layer, the electron transport layer being made of a piezoelectric material that is mechanically deformed such that it generates a voltage or charge that modifies an energy barrier between the electron transport layer and the photoactive layer.

18 Claims, 6 Drawing Sheets

PIEZOELECTRIC-BASED SOLAR CELLS

CROSS-REFERENCE TO RELATED APPLICATION

This application claims priority to U.S. Provisional Application Ser. No. 62/206,480, filed Aug. 18, 2015, which is hereby incorporated by reference herein in its entirety.

BACKGROUND

The two main challenges in solar cell technology are the cost and the energy conversion efficiency of solar cells. Different materials and structures have been tested for several decades to address these challenges. As a result, the technology has evolved from the first solar cell generation, starting with crystalline silicon based p-n junctions, to the third generation, which includes organic photovoltaics (OPVs), dye sensitized solar cells (DSSCs), and perovskite (PVSK) solar cells. While the choices of the photoactive material in different devices (organic semiconductors in OPVs, dyes in DSSCs, and perovskites in PVSKs) are mainly based up on which materials provide strong light absorption and efficient charge generation, the device structures must be designed to collect the charges efficiently from the photoactive materials and transfer the charges to the device electrodes. The approach for selective collection of electrons from photoactive layers in OPVs, DSSCs, and PVSKs is to use a layer of a material, referred to as an electron transport layer (ETL), having an energy structure that can block holes but is transparent to electrons so as to enable electron transport.

The energy levels in the ETL and the energy barrier between ETL and the photoactive layer are critical to achieve high energy conversion efficiency in a device. Therefore, many different materials have been tested for use in forming ETLs in OPVs, DSSCs, and PVSKs. These materials include metal oxides, such as titanium oxide ($TiO_2$) and zinc oxide (ZnO), and organic materials. Although, in theory, some materials should be more effective in improving device characteristics, in practice, significant improvement has not been achieved when ETL materials having matched energy levels have been used. This is mainly due to the other requirements for ETLs, such as optical transparency and high mobility of carriers. The combination of all the requirements of an ETL has limited the choice of material for ETL formation to only a few materials. For instance, $TiO_2$ has been the dominant ETL in DSSCs for more than two decades.

From the above discussion, it can be appreciated that it would be desirable to have alternative ETLs that provide improved energy conversion efficiency.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

As described above, it would be desirable to have alternative electron transfer layers (ETLs) that provide improved energy conversion efficiency in solar cells. Disclosed herein are ETLs that undergo mechanical deformation during use of the solar cell that generates a voltage or charge that modifies the energy barrier between the ETL and the photoactive layer of the solar cell so as to increase the energy conversion efficiency of the cell. The ETLs are made of a piezoelectric material and the mechanical deformation of the ETL can be achieved in various ways. In some embodiments, the ETL is deformed during use of the device by applying an external force to the cell, and this deformation results in the voltage/charge generation. In other embodiments, the ETL is formed (e.g., deposited or grown) on a substrate while it is in a deformed state. Once the ETL is completed, the substrate can be enabled to relax and return to its natural state and this creates internal stress within the ETL that results in the voltage/charge generation. The deformation of the substrate during ETL formation can be achieved in various ways. For example, an external force can be applied to the substrate to cause it to deform. Alternatively, the substrate can be heated during the ETL formation process so as to cause thermal expansion that subsides once the temperature is reduced.

In the following disclosure, various specific embodiments are described. It is to be understood that those embodiments are example implementations of the disclosed inventions and that alternative embodiments are possible. All such embodiments are intended to fall within the scope of this disclosure.

Figure 1A:
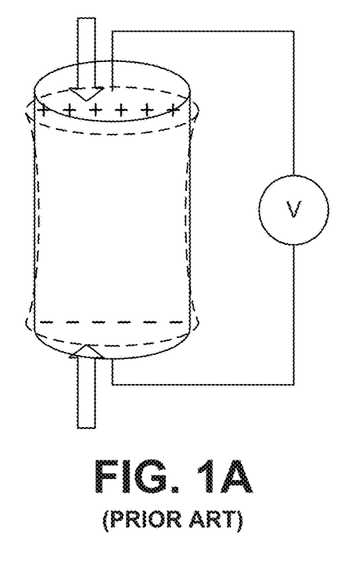
FIGS. 1A and 1B are schematic drawings that illustrate the direct piezoelectric effect generating charge/voltage in response to (A) compressive and (B) shear stresses.
Figure 1B:
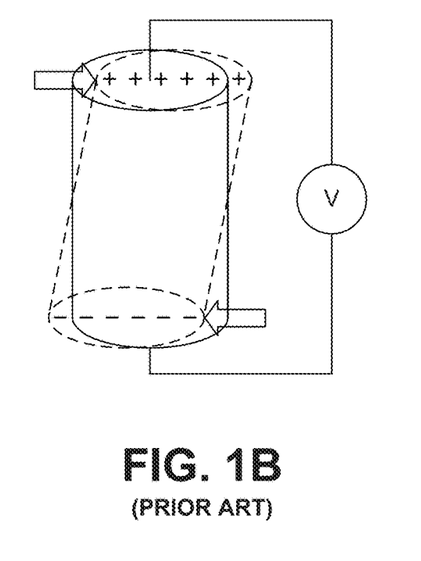

Piezoelectricity is an effect in certain materials i.e., piezoelectric materials, through which electric charges are generated on the surface of the materials in response to mechanical deformations. FIGS. 1A and 1B illustrate this effect with cylindrical members made of a piezoelectric material that are deformed by external forces (represented with arrows). The charges can generate a potential across the material due to the established electric field (E). The relationship between mechanical and electrical behavior of a piezoelectric material is described through two equations:

$$S = s \cdot T + d \cdot E \quad (1)$$

$$D = d \cdot T + \epsilon \cdot E \quad (2)$$

where S, T, D, and E are mechanical strain and stress, electric displacement, and electric field, respectively, and s, d, and $\epsilon$ are elasticity coefficient, piezoelectric charge coefficient, and permittivity, respectively. Considering that S, T, D, and E are vectors, s, d, and $\epsilon$ are generally in the form of matrices. Therefore, Equation 2 suggests that any stress to a piezoelectric material (even shear stress, see FIG. 1B) may generate electric displacement (D), which is linearly related to the electric dipole moment in the material. According to Equation (2), the magnitude of the generated dipole depends on the magnitude and direction of the stress and the value of d in the material. The piezoelectric electric coefficient is different in different materials, and its value depends on the molecular structure and the orientation of the crystal.

Zinc oxide (ZnO) is one of the emerging piezoelectric materials with possible applications in various electro-mechanical devices. ZnO can be deposited as a film with conventional methods, such as sputtering. In addition, ZnO nanowires can be vertically grown on a substrate using a simple hydrothermal growth process. Furthermore, grown nanowires can be shaved and laid on a flexible substrate for making piezoelectric sensors. Experiments have shown that a voltage difference appears along the nanowires when they are bent. Other experiments have shown that piezoelectric voltage is generated by vertically grown ZnO nanowires when shear stresses are applied by an atomic force microscope tip.

Recently, the inventors developed a simple method for inducing piezoelectric charges along vertically grown ZnO nanowires without any need for shaving them or individually bending them. In that method, nanowires were grown on a flexible substrate while the growth solution was stirred, which produced misaligned grown nanowires instead parallel nanowires. Due to the physical contact between nanowires, stress was applied to the nanowires when the substrate was bent. This produced a voltage of approximately 350 mV, which was measured using a devised method in an electrochemical cell. Such a voltage is sufficient to modify the energy structure of a junction in a photovoltaic device.

Early organic photovoltaics (OPVs) were made by forming layers of electron donor (D) and electron acceptor (A) materials between two different electrodes, one being transparent. In an OPV, upon illumination, excited states are generated by promoting electrons from the highest occupied molecular orbitals (HOMO) to the lowest unoccupied molecular orbitals (LUMO), creating excitons (electro-hole pairs). The excitons can diffuse to the interface between the donor and acceptor, where electrons and holes get separated (electrons at the LUMO of A, holes at HOMO level of D). Common organic electron donor and acceptor materials used in OPVs include poly 3-hexylthiophene (P3HT) and phenyl-C61-butyric acid methyl ester (PCBM), respectively.

Figure 2A:
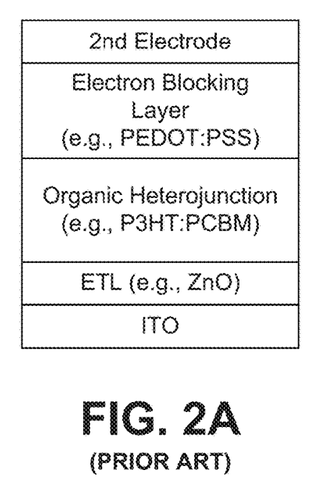
FIG. 2A is a schematic drawing of a structure of an inverted bulk heterojunction organic photovoltaic (OPV) with P3HT and PCBM semiconductors.
Figure 2B:
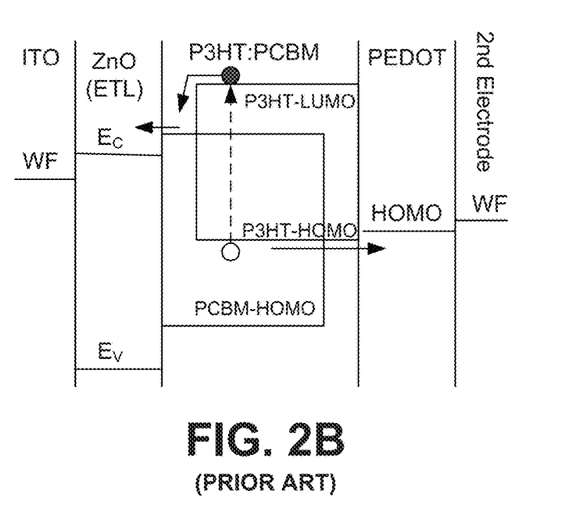
FIG. 2B is a diagram that illustrates the energy structure of the OPV of FIG. 2A.

While early devices showed some photovoltaic effect, it was soon discovered that some modification to the structure was needed for increasing the efficiency. Today, the highest efficiency in a single cell is obtained by a structure called inverted bulk heterojunction (9.2%). The structure and the molecular energy diagram of such a device are shown in FIGS. 2A and 2B, respectively. The device can be fabricated by making a thin film of an ETL on a transparent electrode that usually comprises a transparent, electrically conductive coating of material, such as indium tin oxide (ITO). Then, a blend solution of P3HT:PCBM is deposited on the ETL as a photoactive layer. Alternatively, a perovskite (PVSK) material can be used instead of the blend solution to form a PVSK device. On top of that, a thin layer of poly ethylene-dioxythiophene:polystyrene sulfonate (PEDOT:PSS) can be deposited as the electron blocking layer (EBL). At the very top is the second electrode. The mechanism of charge generation and separation in the photoactive layer is the same as explained in the early devices. However, the ETL and the EBL are able to rectify the electron path for selective collection of electrons and holes by the bottom and top electrodes, respectively. Also, those layers reduce the recombination rate in the device, resulting in efficiency enhancement. Due to its large band gap (transparent) and energy levels, ZnO is one of the best candidates for ETL in OPVs.

Figure 3:
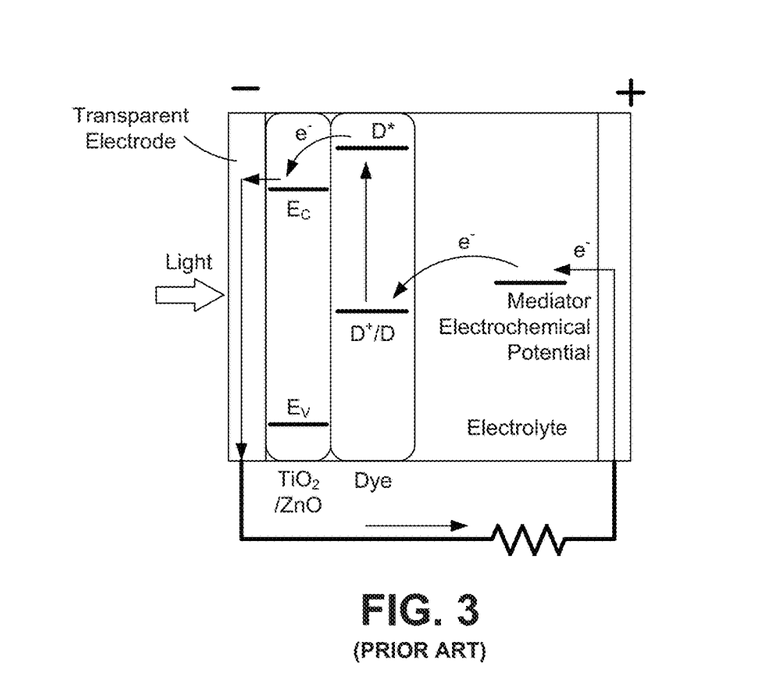
FIG. 3 is a schematic diagram of the energy structure in a dye sensitized solar cell (DSSC).

The schematic drawing of FIG. 3 shows the structure and energy levels in a dye sensitive solar cell (DSSC). In a DSSC, a porous film of a wide band gap semiconductor (e.g., titanium oxide ($TiO_2$) or ZnO) is applied to a transparent semiconductor to form a transparent electrode. The surface of the substrate is coated with a layer of dye (which acts as the photoactive layer) before using the electrode in the cell. The most common form of dyes are ruthenium (Ru) based dyes and porphyrin derivatives due to their efficient photon absorption.

When the electrode is illuminated, the photons pass through the semiconductor and are absorbed by the dye molecules. The absorbed photons promote electrons from the ground state ($D^+/D$) to the excited state ($D^*$) in the dye. Due to the lower energy level in the semiconductor (conduction band energy, $E_c$) than the excited energy level in the dye, the electrons are transferred to the semiconductor, which acts as the ETL. The positive charges on the dye molecules, on the other hand, receive electrons from the counter electrode (typically made of platinum (Pt)) via the mediators in the electrolyte. This process takes place through oxidation of the mediators at the dye interface and mediator reduction at the counter electrode. The key factor in achieving high energy conversion efficiency is to use materials with appropriate energy levels to rectify the charge transfer at the semiconductor-dye-mediator interfaces. Furthermore, a wide absorption spectrum of the dyes and low charge recombination rate at the semiconductor-electrolyte interface are important. In this regard, the energy difference between $E_c$ in the ETL and D* in the dye is crucial for efficient charge collection.

Energy diagrams similar to those shown in FIGS. 2 and 3 are common in scientific publications to show the energy structure of OPVs and DSSCs. Such diagrams are based on the energy levels of the bulk materials at each layer, measured separately. Although this method of energy demonstration is helpful to understand the role of each layer, such energy diagrams are not accurate. The energy levels in a material can be different when there are junctions between the layers. Particularly, when there is a crystalline material, the energy structure has bands instead of levels, and bands would likely be bent near junctions. Considering the crystalline structure of ZnO, the energy structure near the interface between ZnO and the photoactive layer in OPVs, DSSCs, and PVSKs would be more like the one shown in FIG. 4A. In addition to the conduction and valence bands in a crystalline semiconductor, at the surface of the material there are localized states in the bandgap due to the abrupt termination of material and surface defects. These surface states behave like traps for carriers (i.e., electrons and holes). Therefore, the semiconductor would be depleted near the surface, and the energy bands would be bent, introducing an energy barrier between ZnO and the photoactive layer.

Figure 4A:
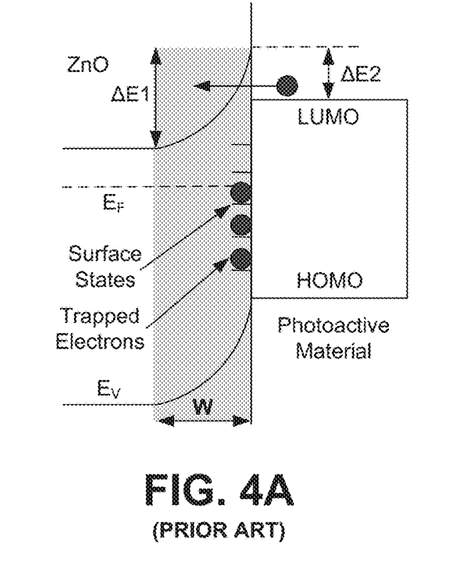
FIG. 4A is a diagram that illustrates band bending in ZnO at the interface. The photoactive layer in OPVs is the electron acceptor (e.g. PCBM) and in DSSCs is the dye material. Although $E_C$ in the bulk is below LUMO, the energy barrier $\Delta E_2$ limits the electron injection.
Figure 4B:
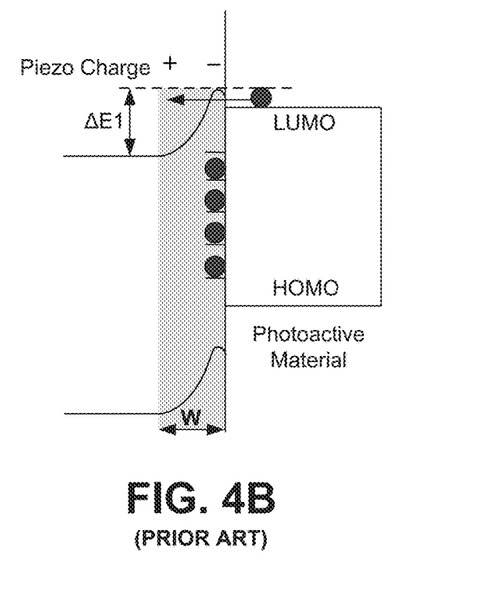
FIG. 4B is a diagram that illustrates the application of a mechanical stress to ZnO nanowires (bending the sample) can generate piezoelectric charges to reduce the barrier and the depletion width (W).

As mentioned above, the existence of the energy barrier is ignored in the conventional energy diagrams for OPVs, DSSCs, and PVSKs. The energy bending ($\Delta E_1$) and depth of the depleted region (W) depends on the structure of the ZnO, surface defects, the growth/deposition method, and the doping level in the semiconductor. It should be noted that the detail of the energy structure on the photoactive layer is also important. However, since both in OPVs and DSSCs, the photoactive layers are made of individual molecules, still the energy structure on the photoactive materials can be presented with HOMO and LUMO levels. As shown in FIG. 4A, while the $E_c$ in the bulk part of ZnO can be lower than LUMO in the photoactive layer, the energy barrier ($\Delta E_2$) can limit the injection of electrons to the ZnO layer.

It has been suggested by others to apply an acoustic wave to induce the piezoelectric voltage inside an OPV to reduce the energy barrier. However, the inventors believe that the approach disclosed in the following paragraphs can address this issue in a simpler way that will lead to a practical solution on how to engineer the barrier without any need for an external vibration source.

Figure 5:
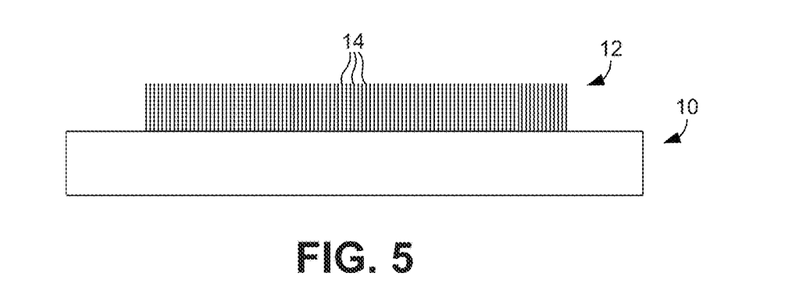
FIG. 5 is a schematic diagram of a substrate and an electron transport layer (ETL) that can form the basis for a solar cell.
Figure 6A:
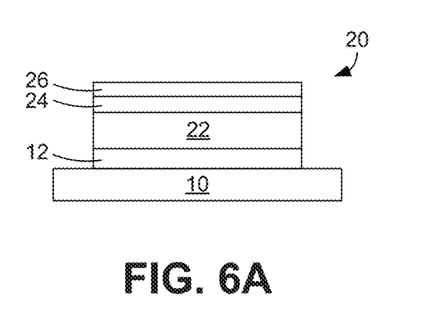
FIG. 6A is a schematic diagram of a first embodiment of an OPV or perovskite (PVSK) solar cell that uses the substrate and ETL shown in FIG. 5.
Figure 6B:
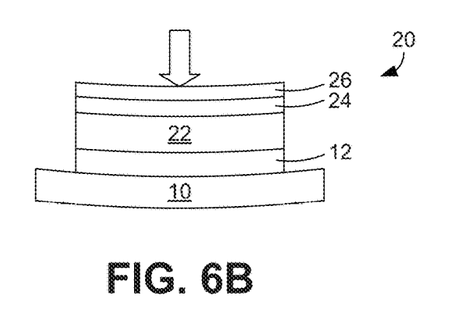
FIG. 6B is a schematic diagram of the solar cell of FIG. 6A being deformed during use to cause the ETL to generate a voltage or current that modifies the energy barrier in the cell.
Figure 7A:
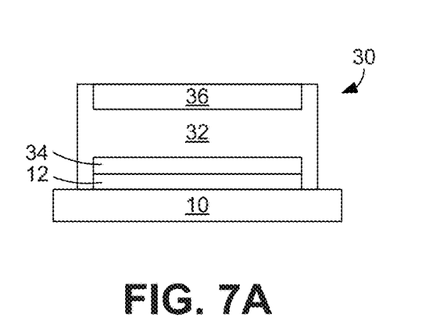
FIG. 7A is a schematic diagram of a first embodiment of DSSC-based solar cell.
Figure 7B:
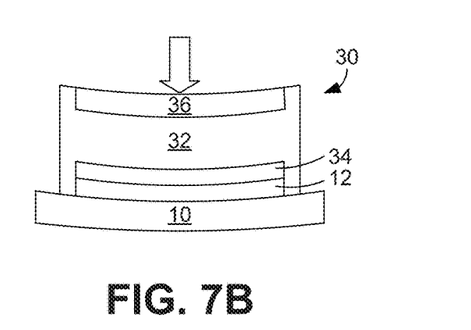
FIG. 7B is a schematic diagram of the solar cell of FIG. 7A being deformed during use to cause the ETL to generate a voltage or current that modifies the energy barrier in the cell.

FIGS. 5-7 illustrate a first embodiment in which ETLs of OPV, DSSC, and PVSK solar cells are mechanically deformed to modify the energy barrier between the ETLs and the photoactive layers of the cells to obtain higher energy conversion efficiency. In this embodiment, the solar cells are mechanically deformed during their use by applying an external force to the solar cell.

Whether the solar cell is an OPV, DSSC, and PVSK solar cell, the cell comprises a substrate, which acts as a first (bottom) transparent electrode of the cell, and an ETL formed on the substrate. FIG. 5 illustrates an example of a substrate 10 upon which has been grown an ETL 12 that comprises a plurality of vertical nanowires 14 that extend generally perpendicularly upward from the substrate. The substrate 10 is a made of a transparent material, such as polyethylene terephthalate (PET) that is coated with a transparent, electrically conductive material, such as ITO, and the ETL nanowires 14 are made of a piezoelectric material, such as ZnO (e.g., ZnO nanowires). Although nanowires are shown in FIG. 5, it is noted that ETL 12 can, alternatively, comprise a continuous layer, a plurality of nanoparticles, a plurality of nanorods, a plurality of nano-flowers, or another structure made of a piezoelectric material. Irrespective of the nature of the ETL 12, the ETL is grown upon the substrate 10 while the substrate is in a relaxed (i.e., non-deformed) state.

With reference next to FIG. 6A, illustrated is an OPV or PVSK solar cell 20 that incorporates the substrate 10 and ETL 12. Formed on top of the ETL 12 is a photoactive layer 22. In cases in which the solar cell is an OPV, the photoactive layer 22 can comprise an organic heterojunction that can, for example, be made of P3HT:PCBM. In cases in which the solar cell is PVSK solar cell, the photoactive layer 22 can comprise a perovskite material.

Formed on top of the photoactive layer 22 is an EBL 24 that blocks electrons but is transparent to holes. In some embodiments, the EBL 24 is made of PEDOT:PSS. Finally, formed on the EBL 24 is a second (top) electrode 26 that can be made of a suitable conductive material, such as silver, aluminum, carbon, or ITO.

With reference next to FIG. 7A, illustrated is a DSSC solar cell 30 that also incorporates the substrate 10 and ETL 12. In this case, formed on top of the substrate 10 and the ETL 12 is an electrolyte layer 32 that comprises a dyed region 34 immediately adjacent to and in contact with the ETL 12 that acts as the photoactive layer. In some embodiments, the electrolyte layer 32 is made of a solvent (e.g., water, acetonitrile) and a salt containing redox ions (e.g., $I_2/I_3$) and the dye comprises an Ru-based dye or a porphyrin derivative. Formed on or in the electrolyte layer 32 is second (top) electrode 36 that can be made of a platinum or carbon material.

The use of the OPV/PVSK solar cell 20 and the DSSC 30 is illustrated in FIGS. 6B and 7B, respectively. As shown in each of these figures, the completed solar cell 20, 30 can be mechanically deformed by applying an external force, such as a compressive and/or tensile force, to the cell. In some embodiments, this force can be a bending force. The application of the force causes mechanical deformation of the ETL 12. For example, when the ETL 12 comprises piezoelectric nanowires, the wires are pressed against each other causing the wires to bend. Regardless, internal stress within the ETL 12 generates a piezoelectric voltage or charge that modifies the energy barrier between the ETL and the cell's photoactive layer.

Figure 8:
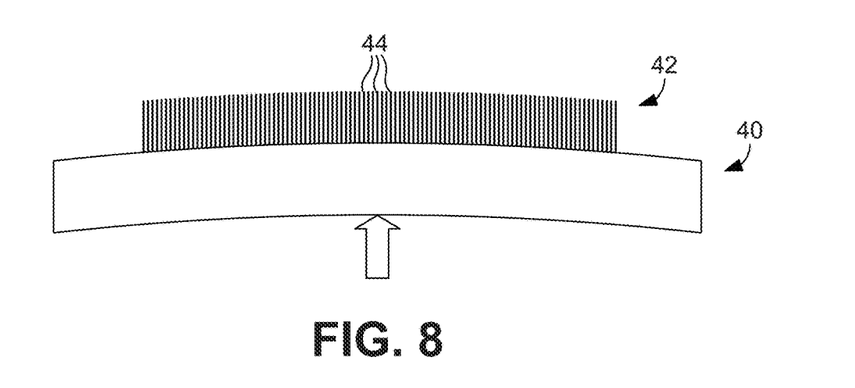
FIG. 8 is a schematic diagram of a substrate and an electron transport layer (ETL) that can form the basis for a solar cell, wherein the ETL is formed on the substrate while it is in a deformed state.
Figure 9:
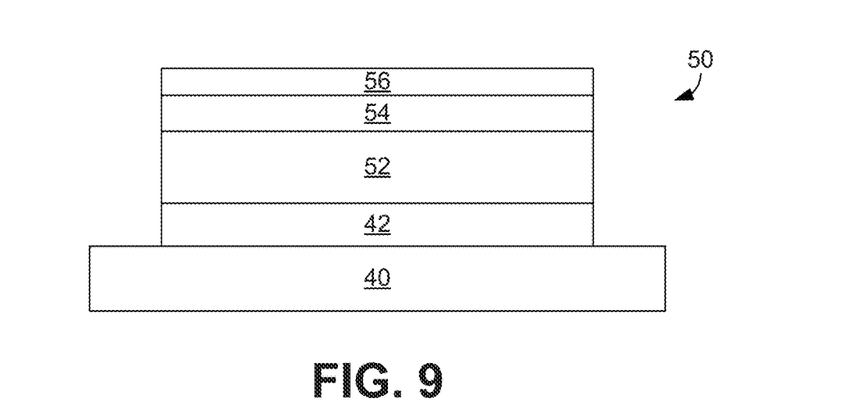
FIG. 9 is a schematic diagram of a second embodiment of an OPV or PVSK solar cell that uses the substrate and ETL shown in FIG. 8.
Figure 10:
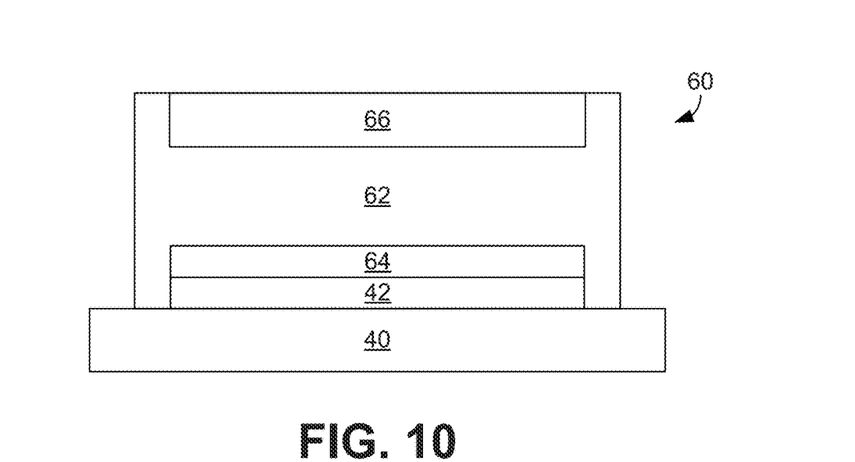
FIG. 10 is a schematic diagram of a second embodiment of a DSSC-based solar cell that uses the substrate and ETL shown in FIG. 8.

FIGS. 8-10 illustrate a second embodiment in which ETLs of OPV, DSSC, and PVSK solar cells are mechanically deformed to modify the energy barrier between the ETLs and the photoactive layers of the cells to obtain higher energy conversion efficiency. In this embodiment, the ETL is formed on the substrate while the substrate is deformed. In such a case, when the substrate (and the solar cell as a whole) is enabled to relax and return to its relaxed state, the ETL will be mechanically deformed and, therefore, internally stressed. As before, this stress generates a piezoelectric voltage/charge that modifies the energy barrier between the ETL and the cell's photoactive layer.

With reference to FIG. 8, a substrate 40 is deformed and an ETL 42 is formed on the substrate while it is in its deformed state. As before, the ETL 42 can comprise a plurality of vertical nanowires 44 that extend generally perpendicularly upward from the substrate 40. The substrate 40 is a made of a transparent material, such as polyethylene terephthalate (PET) that is coated with a transparent, electrically conductive material, such as ITO, and the ETL nanowires 44 are made of a piezoelectric material, such as ZnO (e.g., ZnO nanowires). Although nanowires are shown in FIG. 8, it is noted that ETL 42 can, alternatively, comprise a continuous layer, a plurality of nanoparticles, a plurality of nanorods, a plurality of nano-flowers, or another structure made of a piezoelectric material.

As shown in FIG. 8, the substrate 40 can be deformed such that its top surface has a convex shape. It is noted that the substrate 40 can be mechanically deformed in a variety of different ways. For example, a compressive and/or tensile (e.g., bending) force can be applied to the substrate during solar cell fabrication. In other embodiments, the substrate can be heated during fabrication so as to cause thermal expansion that mechanically deforms the substrate.

Once the ETL 42 has been formed, the remainder of the solar cell can be formed. In some embodiments, the substrate 40 can be left in the deformed state while the other layers of the solar cells are formed. In other embodiments, the substrate 40 can be permitted to relax before the other layers are formed. Illustrated in FIG. 9 is an OPV or PVSK solar cell 50 that incorporates the substrate 40 and ETL 42. Formed on top of the ETL 42 is a photoactive layer 52. In cases in which the solar cell is an OPV, the photoactive layer 52 can comprise an organic heterojunction that can, for example, be made of P3HT:PCBM. In cases in which the solar cell is PVSK solar cell, the photoactive layer 52 can comprise a perovskite material.

Formed on top of the photoactive layer 52 is an EBL 54 that blocks electrons but is transparent to holes. In some embodiments, the EBL 54 is made of PEDOT:PSS. Finally, formed on the EBL 54 is a second (top) electrode 56 that can be made of a suitable conductive material, such as silver, aluminum, carbon, or ITO.

With reference next to FIG. 9, illustrated is a DSSC solar cell 60 that also incorporates the substrate 40 and ETL 42. In this case, formed on top of the substrate 40 and the ETL 42 is an electrolyte layer 62 that comprises a dyed region 64 immediately adjacent to and in contact with the ETL 42 that acts as the photoactive layer. In some embodiments, the electrolyte layer 62 is made of a solvent (e.g., water, acetonitrile) and a salt containing redox ions (e.g., I2/I3) and the dye comprises an Ru-based dye or a porphyrin derivative. Formed on or in the electrolyte layer 62 is second (top) electrode 66 that can be made of a platinum or carbon material.

Once the solar cell 50, 60 has been fabricated, it can be used in its relaxed state. Because the ETL 42 was formed while the substrate 40 was deformed, however, the internal stress is created within the ETL that generates a piezoelectric voltage or charge that modifies the energy barrier between the ETL and the cell's photoactive layer.

The inventors' preliminary experimental results described below support the feasibility of changing the piezoelectric voltage/charge at the surface of an ETL by simply bending the samples. Also, a drift in the knee voltage of an organic diode has been observed upon mechanical deformation, again supporting the feasibility of employing the piezoelectric effect for energy modification in a device.

The inventors previously grew ZnO nanowires on flexible ITO electrodes using the hydrothermal method. It was discovered that by constantly stirring the growth solution the nanowires would be twisted as they grow. Samples with various lengths of nanowires were fabricated by controlling the growth time. The twisting structure was the key part for obtaining the piezoelectric effect from the nanowires when the electrode is bent. Upon bending, the stress between nanowires increased resulting the generation of the piezoelectric charge/voltage. The piezoelectric effect was characterized at various curvatures of the electrode using a devised electrochemical approach.

Figure 11A:
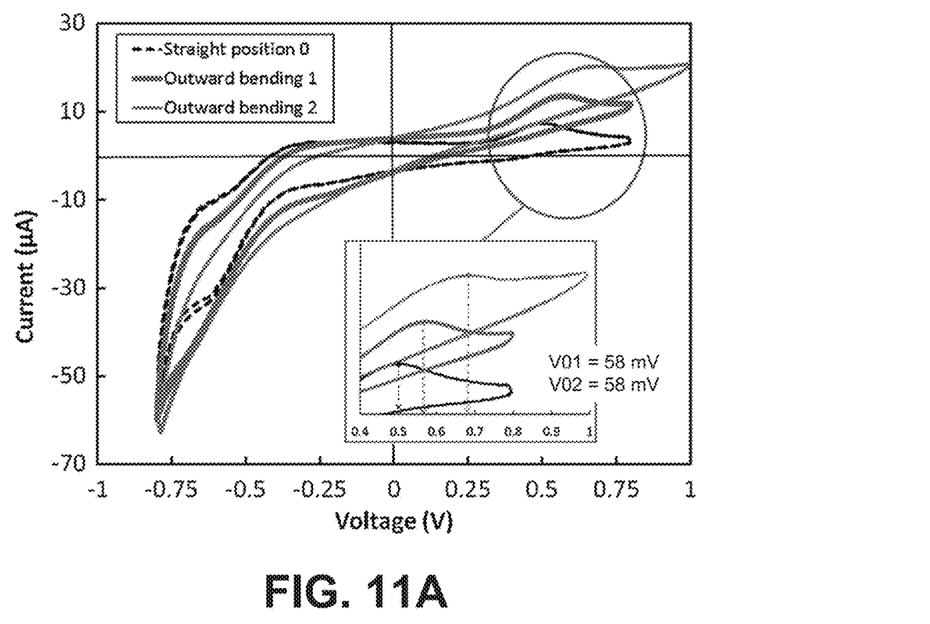
FIG. 11A is a graph that shows CV results from a ZnO nanowires sample at two different curvatures tested in an electrolyte containing ferrocene as a probing redox material. The inset shows the shift in the redox peak upon bending the sample which implies the formation of the piezoelectric voltage at the interface between ZnO nanowires and the electrolyte.
Figure 11B:
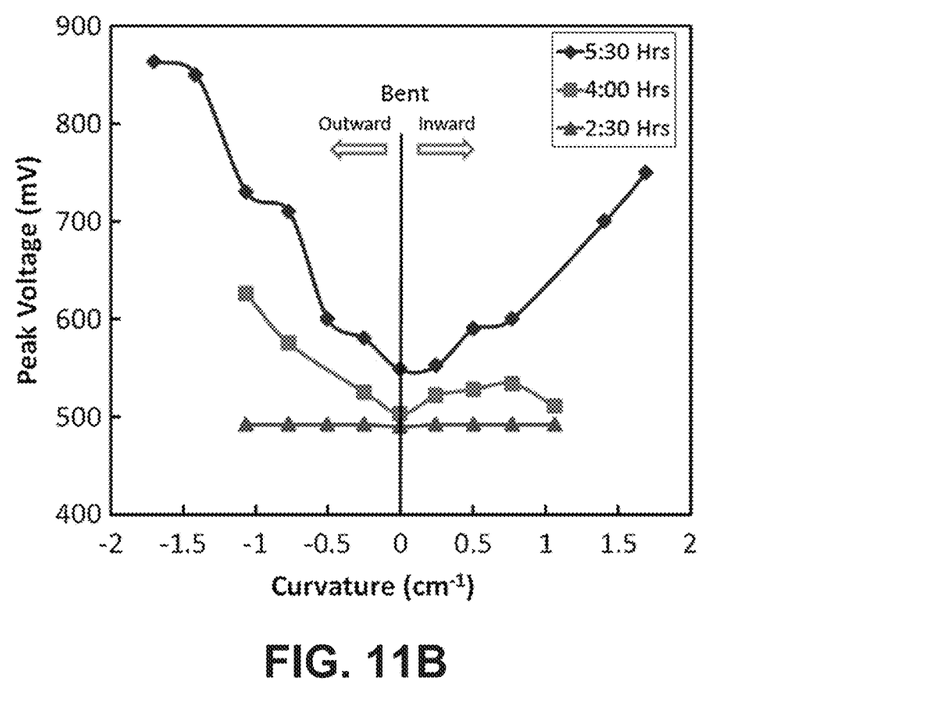
FIG. 11B is a graph that shows ferrocene peak potential versus curvature in samples with different length of grown ZnO nanowires (760 nm, 1100 nm, 1470 nm). In the largest change, the peak voltage was drifted by ~350 mV (induced piezoelectric voltage).

In the novel devices/methods disclosed herein, the electrochemical reaction of ferrocene was used as a reference and the cyclic voltammetry (CV) technique was used to find the electrochemical potential of ferrocene when the electrode was relaxed (straight position 0 in FIG. 11A). The change in the electrochemical potential was monitored after bending the sample. The voltage drift clearly showed the effect of generated voltage across the ZnO layer. It was also found that the amount of the voltage is a function of the curvature and the piezoelectric effect is more pronounced for samples with longer nanowires (FIG. 11B). For a sample with an average nanowire length of 1470 nm, a piezoelectric voltage as large as 350 mV was observed. Although the piezoelectric voltage is usually in range of 100 V in commercial products, the overall effect was much weaker in the tested sample due to the nanowire structure of the material and the limited stress from adjacent nanowires. However, for the proposed application, 350 mV is sufficient to make a significant change on the band bending in a semiconductor ($\Delta E_1$ is usually less than 1 eV in most semiconductors). The experiments also confirmed that the piezoelectric effect can be employed in electrochemical devices, which supports the application of the approach for making DSSCs.

Figure 12:
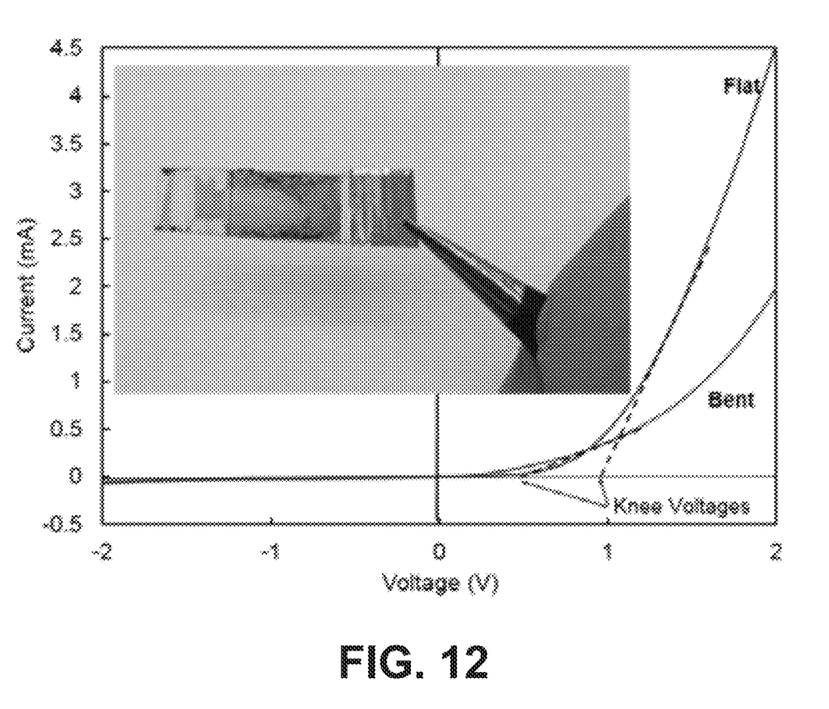
FIG. 12 is a graph that shows the I-V curves from the ZnO nanowire-based organic diode in flat and bent modes. The knee voltage drift shows the piezoelectric effect on the junction barrier. A picture of the sample is inset in the figure.

The feasibility of employing the piezoelectric effect in a solid-state device was also tested by fabricating an organic diode. The device was made by coating the surface of an ITO/twisted ZnO nanowire electrode with a layer of P3HT and brushing silver paint on the top of the stack to make the second electrode. FIG. 12 clearly shows that the knee voltage in the I-V curve was drifted when the sample was bent, indicating the effect of the piezoelectric charge/voltage on the energy barrier of the rectifying junction. Additionally, the feasibility of making a fully flexible device for bending experiments was demonstrated in this test.

The invention claimed is:

1. A solar cell comprising:
   a transparent electrode;
   a photoactive layer; and
   an electron transport layer positioned between the transparent electrode and the photoactive layer, the electron transport layer being made of a piezoelectric material that is mechanically deformed such that it generates a voltage or charge that modifies an energy barrier between the electron transport layer and the photoactive layer.

2. The solar cell of claim 1, wherein the solar cell is an organic photovoltaic solar cell and the photoactive layer comprises an organic heterojunction.

3. The solar cell of claim 1, wherein the solar cell is a perovskite solar cell and the photoactive layer comprises a perovskite material.

4. The solar cell of claim 2 or 3, further comprising an electron blocking layer formed on the photoactive layer.

5. The solar cell of claim 4, further comprising a second electrode formed on the electron blocking layer.

6. The solar cell of claim 1, wherein the solar cell is a dye sensitized solar cell and the photoactive layer comprises a photoactive dye.

7. The solar cell of claim 6, wherein in the photoactive dye is present within an electrolyte layer formed on the electron transport layer.

8. The solar cell of claim 7, further comprising a second electrode formed on or in the electrolyte layer.

9. The solar cell of claim 4, further comprising a second electrode formed on the electron blocking layer.

10. The solar cell of claim 1, wherein the electron transport layer is made of zinc oxide.

11. The solar cell of claim 1, wherein the electron transport layer comprises an array of piezoelectric nanowires.

12. The solar cell of claim 11, wherein the piezoelectric nanowires are zinc oxide nanowires.

13. The solar cell of claim 1, wherein the mechanical deformation results from an external force applied to the solar cell during use of the solar cell.

14. The solar cell claim 1, wherein the mechanical deformation results from the electron transport layer being formed on the transparent electrode while in a mechanically deformed state during fabrication of the solar cell.

15. A method for using a solar cell comprising a transparent electrode, a photoactive layer, and a piezoelectric electron transport layer positioned between the transparent electrode and the photoactive layer, the method comprising:

mechanically deforming the solar cell and, thereby, the electron transport layer so as to create internal stress within the electron transport layer that generates a piezoelectric voltage or charge that modifies an energy barrier between the electron transport layer and the photoactive layer; and exposing the solar cell to light.

16. A method for fabricating a solar cell, the method comprising:

mechanically deforming a transparent electrode;

forming a piezoelectric electron transport layer on the transparent electrode while in its deformed state; and forming a photoactive layer on the electron transport layer.

17. The method of claim 16, wherein mechanically deforming comprises applying an external force to the transparent electrode.

18. The method of claim 16, wherein mechanically deforming comprises heating the transparent electrode to cause thermal expansion of the electrode.

* * * * *